United States Patent
Nakaji et al.

(10) Patent No.: US 6,734,519 B1
(45) Date of Patent: May 11, 2004

(54) WAVEGUIDE PHOTODIODE

(75) Inventors: Masaharu Nakaji, Tokyo (JP); Eitaro Ishimura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/388,630

(22) Filed: Mar. 17, 2003

(30) Foreign Application Priority Data

Oct. 21, 2002 (JP) ......................................... 2002-306292

(51) Int. Cl.[7] .............................................. H01L 31/075
(52) U.S. Cl. .................... 257/458; 257/79; 257/103; 257/257; 257/656; 438/22; 438/24; 438/46; 438/47; 438/48
(58) Field of Search ................................ 257/256, 257, 257/430, 458, 656

(56) References Cited

U.S. PATENT DOCUMENTS 5,953,149 A      9/1999  Ishizaka
6,177,710 B1 *   1/2001  Nishikata et al. ............ 257/429
2002/0123166 A1 * 9/2002  Hasegawa et al. ............ 438/46
2002/0187580 A1 * 12/2002 Kondo et al. .................. 438/47

FOREIGN PATENT DOCUMENTS

| JP | 9-64459 | 3/1997 |
| JP | 9-116233 | 5/1997 |
| JP | 10-003063 | 1/1998 |
| JP | 2001-111095 | 4/2001 |

* cited by examiner

Primary Examiner—David Nelms
Assistant Examiner—Andy Huynh
(74) Attorney, Agent, or Firm—Leydig, Voit & Mayer, Ltd.

(57) ABSTRACT

A waveguide photodiode includes an n-type cladding layer, an n-type light confining layer, an i-type light absorption layer, a p-type light confining layer, and a p-type cladding layer buried in an Fe—InP blocking layer on a semiconductor substrate. At least one of the p-type light confining layer and the p-type cladding layer contains a p-type impurity selected from Be, Mg, and C. An undoped layer is preferably located between the i-type light absorption layer and the p-type light confining layer.

7 Claims, 13 Drawing Sheets

WAVEGUIDE PHOTODIODE

BACKGROUND OF THE INVENTION

1. Field of the Invention

The present invention relates to a waveguide photodiode, and more particularly to a buried waveguide photodiode used for optical communications systems or the like.

2. Background Art

Waveguide photodiodes, which must operate at high speed, have a structure in which the p/i/n junction portion is buried in a semi-insulative InP layer so as to reduce their capacitance. In the manufacture of a waveguide photodiode each layer is generally formed by use of the metal organic chemical vapor deposition method.

For example, on an InP substrate doped with Fe (iron) as an impurity, the method epitaxially grows, one at a time, an n-InGaAs contact layer, an n-InP cladding layer, an n-InGaAsP light confining layer, an i-InGaAs light absorption layer, a p-InGaAsP light confining layer, a p-InP cladding layer, and a p-InGaAs contact layer. Then, after predetermined areas of these layers are etched, an InP blocking layer doped with Fe (hereinafter referred to as a Fe—InP blocking layer) is epitaxially grown on the n-InP cladding layer. After that, an insulating -film and p-type and n-type electrodes are formed.

The i-InGaAs light absorption layer is a layer with no impurity added thereto, or it is a low-concentration impurity layer of p-type or n-type. The i-InGaAs light absorption layer is sandwiched by the n-InGaAsP light confining layer and the p-InGaAsP-light confining layer, collectively forming a p/i/n junction.

Incidentally, the p-InGaAsP light confining layer, the p-InP cladding layer, and the p-type InGaAs contact layer are generally doped with Zn (zinc) as a p-type impurity. This has caused problems in that Zn diffuses from these layers to the i-InGaAs light absorption layer, turning it into a p-type layer.

A method for solving the problem of diffusion of the p-type dopant Zn is to replace Zn with Be (beryllium) (Japanese Laid-Open Patent Publication No. 9-64459, published 1997). This patent describes thermal diffusion of Zn spreading from a doped p-InP cladding layer and p-InGaAs contact layer to an undoped light absorption layer during epitaxial growth.

In the manufacture of a buried waveguide photodiode, after a p-InP cladding layer and a p-InGaAs contact layer are formed, a Fe—InP blocking layer is formed. This has caused problems in that Zn diffuses into the Fe—InP blocking layer due to the thermal history (heat) of the epitaxial growth process of the Fe—InP blocking layer.

Furthermore, some of the Zn which has diffused into the i-InGaAs light absorption layer may further diffuse, depending on the thermal history.

If Zn diffuses in this way, not only does Zn reach as far as the undoped i-InGaAs light absorption layer and the Fe—InP blocking layer, but also there will be a reduction in the concentration of Zn contained in the doped p-InGaAsP light confining layer, p-InP cladding layer, and p-type InGaAs contact layer. This has caused problems such as increased leakage current, deteriorated device characteristics, and increased operational voltage.

Generally the impurity concentration of the light absorption layer in waveguide photodiodes must be lower than that in electroabsorption modulators (EA modulators). However, none of the buried photodiodes employing a Fe—InP blocking layer is known to include a light absorption layer whose impurity concentration is $1 \times 10^{16}$ cm$^{-3}$ or less.

The diffusion mechanism of Zn spreading into the Fe—InP blocking layer is not thermal vibration, which causes Zn to diffuse into the undoped i-InGaAs light absorption layer. It is considered that the diffusion of Zn proceeds as Zn replaces the dopant Fe which is a phenomenon referred to as counter diffusion. A region in which the concentration of Zn has become equal to that of Fe (as a result of the replacement of Fe with Zn) is called a counter diffusion region, and the leakage current increases as the size of the counter diffusion region becomes larger. Any quantitative relationship between a counter diffusion region and characteristics of the device has not yet been reported. Furthermore, no dopant capable of reducing the counter diffusion region is yet known.

SUMMARY OF THE INVENTION

The present invention is made to solve the above problems, and its object is to provide a waveguide photodiode in which only a small amount of impurities diffuses into the light absorption layer and the blocking layer.

Another object of the present invention is to provide a waveguide photodiode having a small counter diffusion region.

Still another object of the present invention is to provide a waveguide photodiode having good device characteristics obtained as a result of reducing the parasitic capacitance.

Other objects and advantages of the present invention will become apparent from the following description.

According to one aspect of the present invention, a waveguide photodiode comprises a semiconductor substrate, an n-type cladding layer, an n-type light confining layer, an i-type light absorption layer, a p-type light confining layer, a p-type cladding layer, and a Fe—InP blocking layer. The n-type cladding layer, the n-type light confining layer, the i-type light absorption layer the p-type light confining layer, and the p-type cladding layer are buried in the Fe—InP blocking layer in that order over the semiconductor substrate. At least one of the p-type light confining layer and the p-type cladding layer contains as a p-type impurity a material selected from a group consisting of beryllium, magnesium, and carbon.

According to another aspect of the present invention, a waveguide photodiode comprises a semiconductor substrate, an n-type cladding layer, an n-type light confining layer, an i-type light absorption layer, a p-type light confining layer, a p-type cladding layer, a Fe—InP blocking layer, and a p-type contact layer. Then type cladding layer, the n-type light confining layer, the i-type light absorption layer, the p-type light confining layer, and the p-type cladding layer are buried in the Fe—InP blocking layer in that order over the semiconductor substrate. The p-type contact layer is formed on the p-type cladding layer. At least one of the p-type light confining layer, the p-type cladding layer, and the p-type contact layer contains as p-type impurities two or more materials selected from a group consisting of zinc, beryllium, magnesium and carbon.

According to another aspect of the present invention, a waveguide photodiode comprises a semiconductor substrate, an n-type cladding layer, an n-type light confining layer, an i-type light absorption layer, a p-type light confining layer, a p-type cladding layer, and a Fe—InP blocking layer. The n-type cladding layer, the n-type light confining layer, the i-type light absorption layer, the p-type light confining layer, and the p-type cladding layer are buried in the Fe—InP blocking layer in that order over the semiconductor substrate. In the Fe—InP blocking layer, a width of a counter diffusion region of Fe and a p-type impurity is 0.5 µm or less.

Other and further objects, features and advantages of the invention will appear more fully from the following description.

DETAILED DESCRIPTION OF THE PREFERRED EMBODIMENTS

First Embodiment

Description will be made of a waveguide photodiode and a manufacturing method therefor according to a first embodiment of the present invention with reference to FIGS. 1 to 12.

Figure 1:
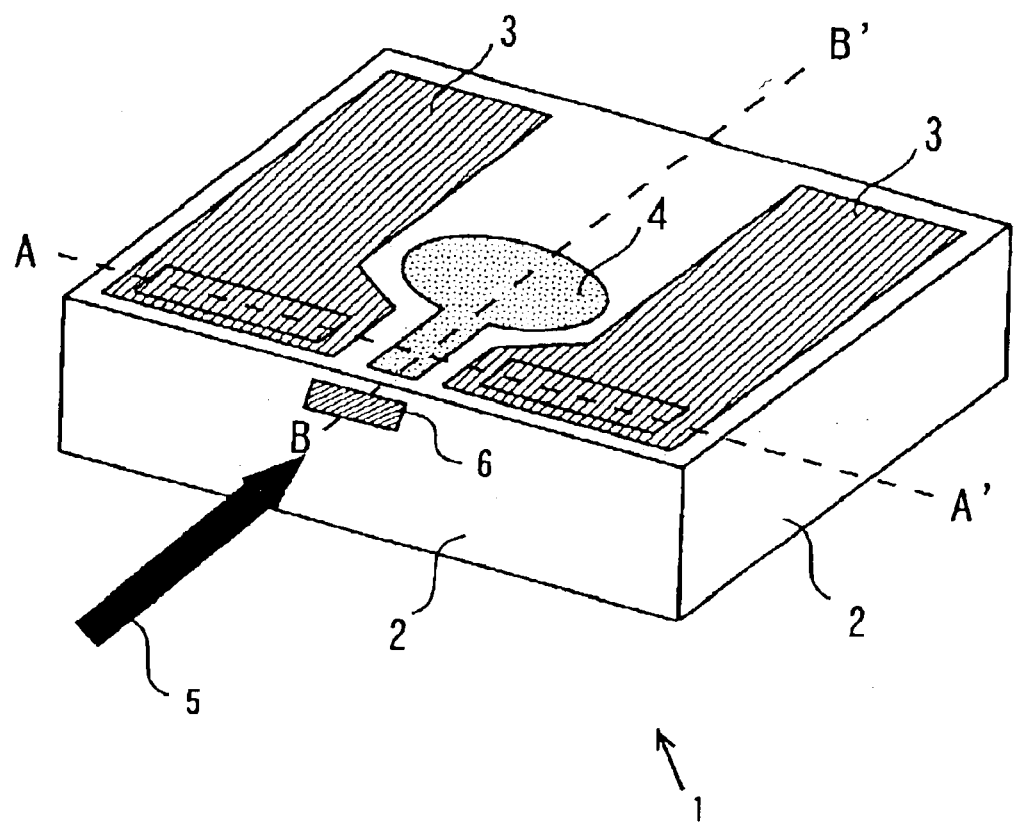
FIG. 1 is a perspective view of a waveguide photodiode of the present invention.

FIG. 1 is a perspective view of the buried waveguide photodiode of the first embodiment. In the figure, a waveguide photodiode 1 has a semi-insulative Fe—InP substrate 2 and an n-type electrode 3 and a p-type electrode 4. Light 5 which has entered the waveguide photodiode 1 is absorbed and thereby disappears as it travels far into the device through a waveguide 6.

Figure 2:
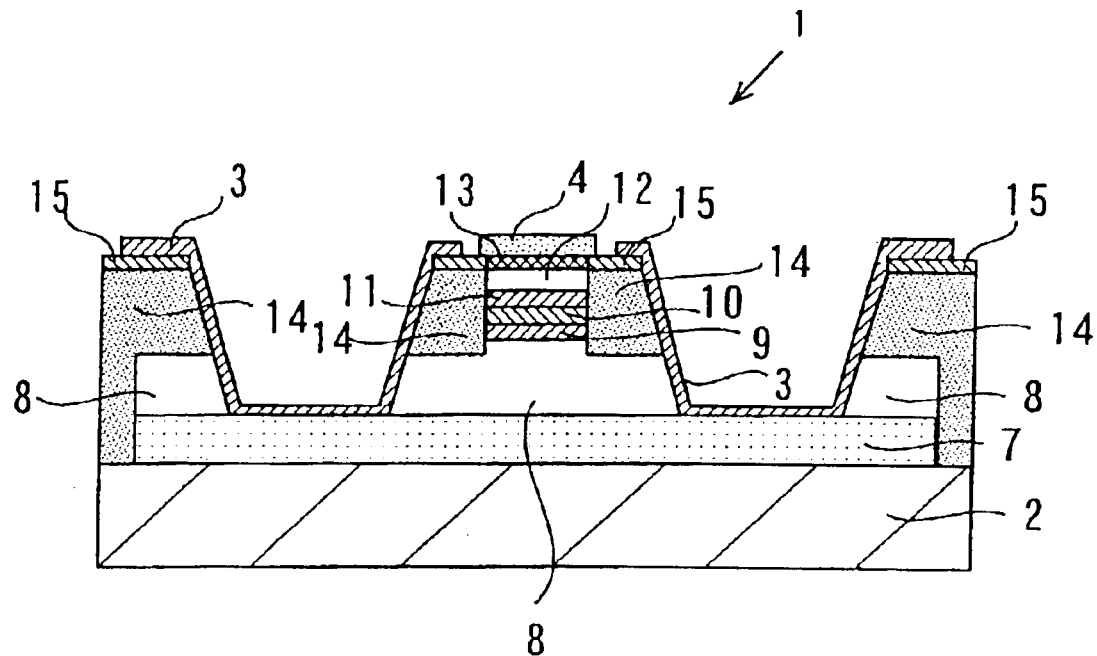
FIG. 2 is a perspective view of a waveguide photodiode of the present invention.
Figure 3:
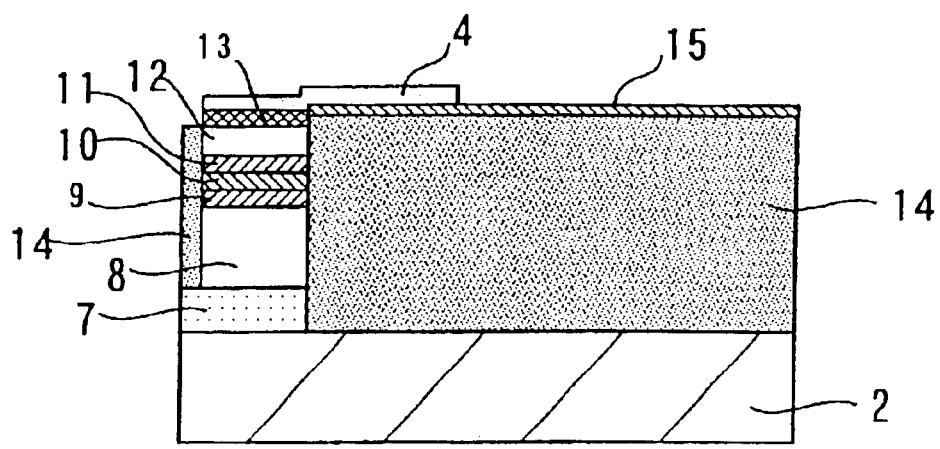
FIG. 3 is a perspective view of a waveguide photodiode of the present invention.

FIG. 2 is a cross-sectional view of the waveguide photodiode of FIG. 1 taken along line A–A', while FIG. 3 is a cross-sectional view of the waveguide photodiode of FIG. 1 taken along line B–B'.

In these figures, the waveguide photodiode 1 includes an n-InGaAs contact layer 7 an n-InP cladding layer 8, an n-InGaAsP light confining layer 9, an i-InGaAs light absorption layer 10, a p-InGaAsP light confining layer 11, a p-InP cladding layer 12, and a p-InGaAs contact layer 13 all formed on the semi-insulative Fe—InP substrate 2. Furthermore, an Fe—InP blocking layer 14 is formed in a predetermined area an the n-InP cladding layer B and an insulating film 15 is formed on the Fe—InP blocking layer 14. The p-type electrode 4 is formed on the p-InGaAs contact layer 13 and a portion of the insulating film 15, while the n-type electrode 3 is formed on the n-InGaAs contact layer 7. In the example shown in FIG. 2, the n-type electrode 3 is also formed on the sides of the n-InP cladding layer 8 and the Fe—InP blocking layer 14 and on the insulating film 15.

According to the present embodiment, the n-InGaAsP light confining layer 9, the i-InGaAs light absorption layer 10, and the p-InGaAsP light confining layer 11 collectively constitute the p/i/n junction. The light confining layers are provided to enhance the light confinement efficiency of the light absorption layer which acts as the waveguide. Therefore, the thicknesses of the n-InGaAsP light confining layer 9 and the p-InGaAsP light confining layer 11 are preferably set to 0.2 µm to 1.5 µm. more preferably 0.3 µm to 1.2 µm. Setting the thickness of the light confining layers too thin leads to a reduction in the light confinement efficiency, which is undesirable. Setting the thickness of the light confining layers too thick also leads to a reduction in the light confinement efficiency and furthermore an increase in the resistance results, which is also undesirable.

The waveguide photodiode of the present embodiment is characterized in that the p-InGaAsP light confining layer 11 or the p-InP cladding layer 12 is doped with an impurity selected from a group consisting of Be (beryllium), Mg (magnesium), and C (carbon). It should be noted that the p-InGaAs contact layer 13 may be doped with one of these impurities.

The elements Be, Mg, and C each have a diffusion coefficient smaller than that of Zn. Therefore, one of Be, Mg, and C can be used as the p type impurity, instead of Zn, to reduce the impurity diffusion into the light absorption layer and the blocking layer. With this arrangement, the light absorption layer can be depleted at low voltage making it possible to reduce the operational voltage and the leakage current.

The carrier concentration (p-type impurity concentration) of the p-InGaAsP light confining layer is preferably set to $1 \times 10^{17}$ cm$^{-3}$ or more, more preferably $5 \times 10^{17}$ cm$^{-3}$ to $1 \times 10^{19}$ cm$^{-3}$. Setting the carrier concentration too high makes the diffusion likely to occur. On the other hand, setting the carrier concentration too low increases the resistance of the device. Both cases are undesirable.

The higher the carrier concentrations (p-type impurity concentrations) of the p-InP cladding layer and the p-InGaAs contact layer the better in terms of reduction of the device resistance. For example, the carrier concentration of the p-InP cladding layer is preferably set to $1 \times 10^{18}$ cm$^{-3}$ or more. It should be noted that the carrier concentration is more preferably set to $1 \times 10^{18}$ cm$^{-3}$ to $3 \times 10^{18}$ cm$^{-3}$ considering the maximum limit of the concentration of Be doped in these layers.

According to the present embodiment, an undoped InGaAsP layer may be formed under the p-InGaAsP light confining layer. In such a case, the thickness of the undoped InGaAsP layer is preferably set to 300 nm or less, more preferably 20 nm to 100 nm.

The formation of the undoped InGaAsP layer under the p-InGaAsP light confining layer means that a layer doped with a p-type impurity (that is, the p-InGaAsP light confining layer) and the light absorption layer are separated by the undoped layer, making it possible to further reduce the impurity diffusion from the doped layer to the light absorption layer.

To reduce the impurity diffusion into the light absorption layer, the thicker the undoped layer, the better. However, since the resistance of an undoped layer is generally high the device resistance increases as the undoped layer becomes thicker. That is, there is a trade-off between (reduction of) the impurity diffusion into the light absorption layer and (reduction of) the device resistance.

According to the present embodiment, one of Be, Mg, and C can be used as an impurity to reduce the impurity diffusion into the light absorption layer even when no undoped layer is employed. Employing an undoped layer can further reduce the impurity diffusion. However, even in this case, it is not necessary to use a thick undoped layer in the present embodiment, as described above. A thin undoped layer can sufficiently produce a desired effect. For example, according to the present embodiment, providing an undoped layer having a thickness of 20 nm to 100 nm can sufficiently reduce the impurity diffusion with only a small increase in the device resistance.

Further according to the present embodiment, the thickness of the i-InGaAs light absorption layer is preferably set to 1.5 $\mu$m or less, more preferably 1.0 $\mu$m or less, even more preferably 0.4 $\mu$m to 0.6 $\mu$m. Better frequency characteristics are obtained with a thinner light absorption layer. However, it is not preferable to make the light absorption layer too thin since it degrades the characteristics of the device.

In waveguide photodiodes, when the length of the i-InGaAs light absorption layer in a direction parallel to the traveling direction of the light is set to, for example, 16 $\mu$m. if the thickness of the layer is 1.5 $\mu$m or less a quantum efficiency of 50% or more can be obtained. Further, with the thickness of the i-InGaAs light absorption layer set to 1.0 $\mu$m or less, it is possible to obtain a quantum efficiency of 60% or more. Still further if the thickness of the i-InGaAs light absorption layer is 0.4 $\mu$m to 0.6 $\mu$m, it is possible to obtain a quantum efficiency of 70%. It should be noted that the term "quantum efficiency" here refers to the efficiency of the conversion of light to electric current in a waveguide photodiode.

Description will be made below of a manufacturing method of a waveguide photodiode according to the present embodiment with reference to FIG. 4A~FIG. 4H.

Figure 4A:
FIGS. 4A to 4H show a method of manufacturing a waveguide photodiode according to the present invention.

First of all, a Fe-doped semi-insulative InP substrate (hereinafter referred to as a Fe—InP substrate) 18 is prepared as shown in FIG. 4A. Doping Fe in an InP substrate makes it possible to increase the resistance of the substrate and thereby reduce the leakage current.

Figure 4B:
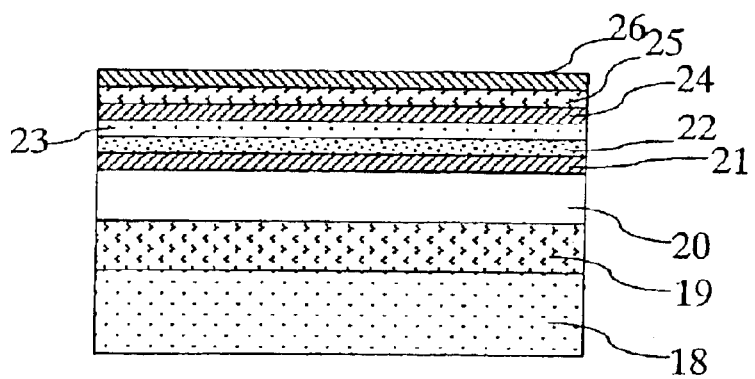

Then, on the Fe—InP substrate 18, the manufacturing method sequentially forms an n-InGaAs contact layer 19, an n-InP cladding layer 20, an n-InGaAsP light confining layer 21, an i-InGaAs light absorption layer 22, an undoped InGaAsP layer 23, a p-InGaAsP light confining layer 24, a p-InP cladding layer 25, and a p-InGaAs contact layer 26, completing the structure shown in FIG. 4B. Specifically, each layer is epitaxially grown one at a time by use of the metal organic chemical vapor deposition method. It should be noted that the undoped InGaAsP layer 23 may not be formed.

The present embodiment is characterized in that the p-InGaAsP light confining layer 24 and the p-InP cladding layer 25 are doped with a material selected from a group consisting of Be, Mg, and C. It should be noted that the p-InGaAs contact layer 26 may also be doped with one of these materials.

Materials which can be used to produce Be include, for example, bis(methylcyclopentadienyl)beryllium, bis(cyclopentadienyl)beryllium, dimethyl beryllium, and diethyl beryllium. Materials which can be used to produce Mg include, for example, bis(methylcyclopentadienyl) magnesium, bis(cyclopentadienyl)magnesium, dimethyl magnesium, and diethyl magnesium. Furthermore, materials which can be used for C include, for example, carbon tetrachloride and carbon tetrabromide.

On the other hand, the n-InGaAs contact layer 19, the n-InP cladding layer 20, and the n-InGaAsP light confining layer 21 may be doped with an appropriate impurity of n type. For example, S (sulfur) may be used as the appropriate impurity of n type for the present embodiment. It should be noted that according to the present embodiment the light absorption layer 22 is not doped with any impurity.

Figure 4C:
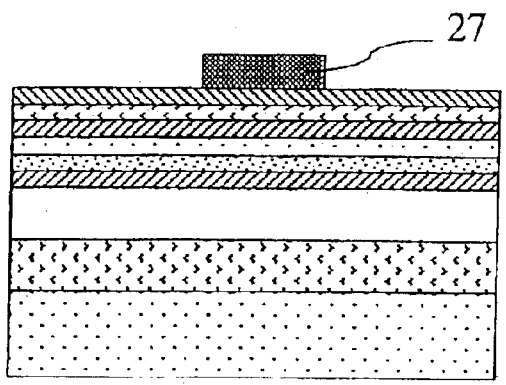
Figure 4D:
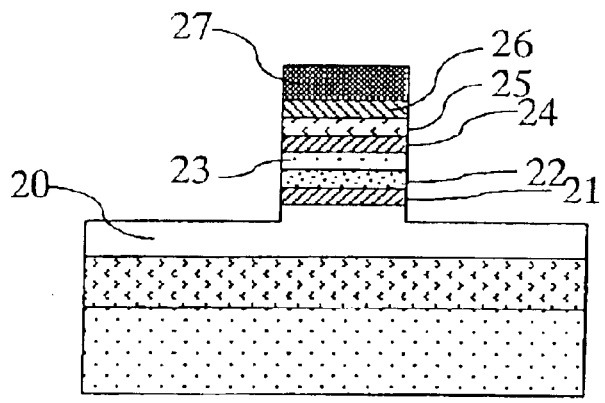
Figure 4E:
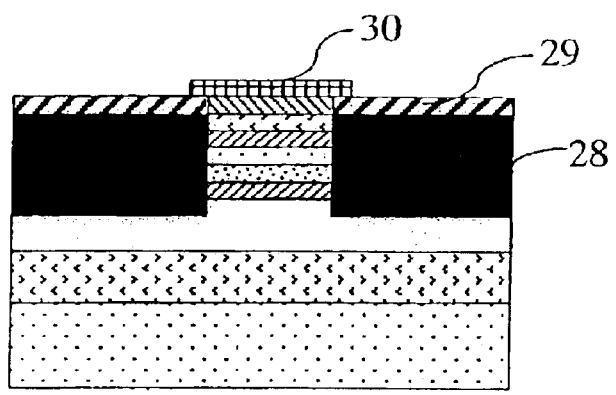

Then, a layer of $SiO_2$ (silicon dioxide), etc. to be used as a mask layer (not shown) is formed on the p-InGaAs contact layer 26. After that, the mask layer is patterned by use of a photolithographic technique to form a mask pattern 27, as shown in FIG. 4C.

Subsequently, by using the mask pattern 27, selective etching is performed on the n-InP cladding layer 20, the n-InGaAsP light confining layer 21, the i-InGaAs light absorption layer 22, the undoped InGaAsP layer 23, the p-InGaAsP light confining layer 24, the p-InP cladding layer 25, and the p-InGaAs contact layer 26. The etching is stopped when the n-InP cladding layer 20 has been etched to a predetermined depth, completing the structure shown in FIG. 4D.

Then, by use of the metal organic chemical vapor deposition method, a Fe—InP blocking layer 28 is formed on the areas on which the mask pattern 27 has not been formed. After that, the mask pattern 27 is removed. Then, after an insulating film 29 is formed on the entire surface and etched by a photolithographic technique, a p-type electrode 30 is formed on the p-InGaAs contact layer 26, completing the structure shown in FIG. 4E. At that time, as shown in FIG. 3, the p type electrode 30 is preferably formed such that the edge portions of the p-type electrode 30 overlap the insulating film 29 to ease the subsequent fabrication processes.

Figure 4F:
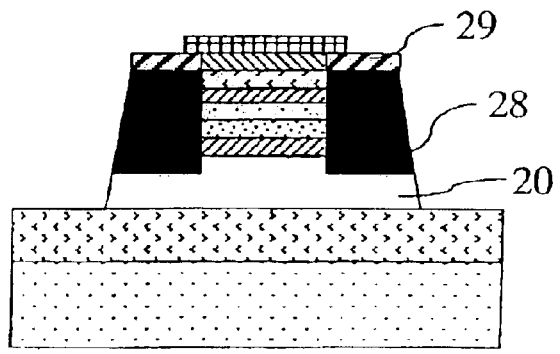

Then, the insulating film 29 and the Fe—InP blocking layer 28 are each etched into a desired shape completing the structure shown in FIG. 4F. At that time, the n-InP cladding layer 20 and the Fe—InP blocking layer 28 are preferably each etched into a tapered shape to avoid breakage, etc. of an n-type electrode when it is subsequently formed.

Figure 4G:
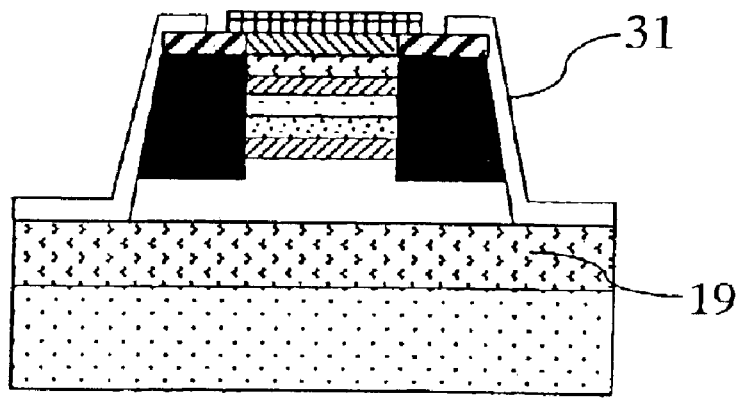
Figure 4H:
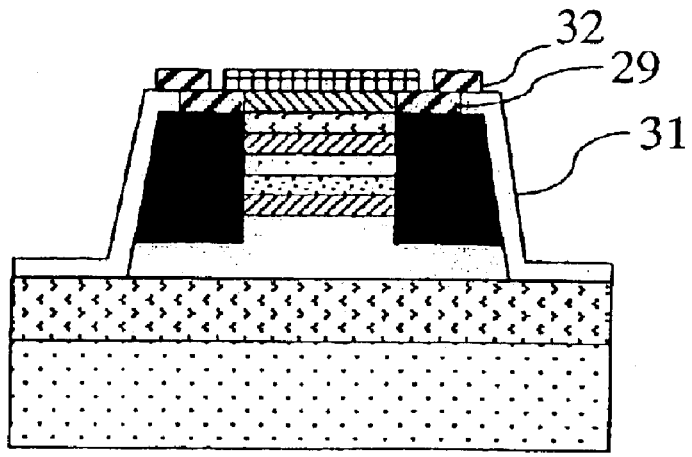

Then, an n-type electrode 31 is formed on the n-InGaAs contact layer 19, completing the structure shown in FIG. 4G. At that time, the n-type electrode 31 is preferably also formed on the sides of the n-InP cladding layer 20 and the Fe—InP blocking layer 28 and on the insulating film 29 to ease the subsequent fabrication processes. After that, each necessary process prescribed by a known method is carried out to produce a waveguide photodiode of the present invention.

It should be noted that the n-type electrode 31 may be formed on the sides of the n-InP cladding layer 20 and the Fe—InP blocking layer 28 and on the upper surface of the Fe—InP blocking layer 28. In such a case, an insulating film 32 is subsequently formed in desired areas on the insulating film 29 and the n-type electrode 31 by use of a photolithographic technique, etc., forming the structure shown in FIG. 4H instead of the structure shown in FIG. 4G.

Description will be made below of diffusion of Be in a waveguide photodiode of the present invention.

FIG. 5 is a cross-sectional view of a sample prepared to investigate how Be diffuses by use of secondary ion mass spectrometry (SIMS). The example in the figure uses S (sulfur) as an n-type impurity. Furthermore, a Be—InGaAsP layer is formed on an i-InGaAs light absorption layer with an undoped InGaAsP layer (i-InGaAsP layer) approximately 100 nm thick between them.

Figure 5A:
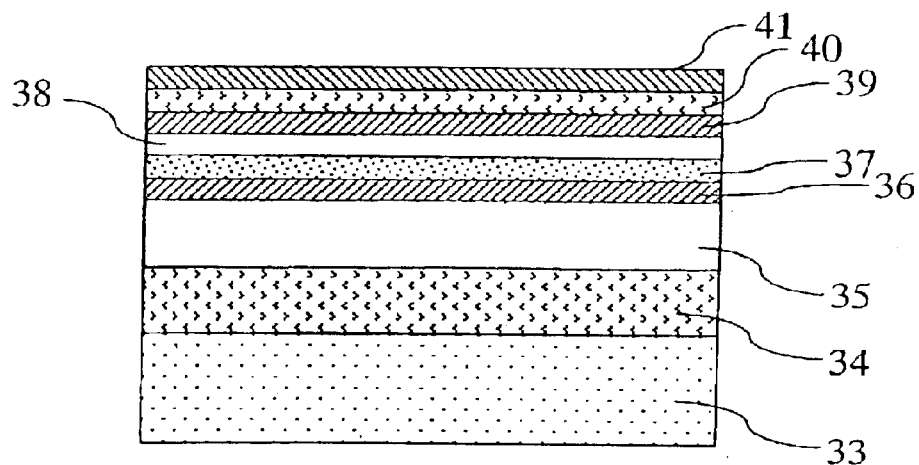
FIG. 5A and FIG. 5B show the manufacturing method of a sample for secondary ion mass spectrometry.

The sample is produced by sequentially forming an S—InGaAs layer 34 an S—InP layer 35, an S—InGaAsP layer 36, an i-InGaAs layer 37, an i-InGaAsP layer 38, a Be—InGaAsP layer 39, a Be—InP layer 40, and a Be—InGaAs layer 41 in that order over an Fe—InP substrate 33 by use of the metal organic chemical vapor deposition method, as shown in FIG. 5A.

It should be noted that in an actual waveguide-type photodiode, the Be—InP cladding layer 12 and the Be—InGaAsP light confining layer 11 are each in contact with the Fe—InP blocking layer 14, as shown in FIG. 2. Therefore, to check how Be diffuses from the Be—InP layer 40 and the Be—InGaAsP layer 39, a Fe—InP layer 42 is formed on the Be—InP layer 40 by the metal organic chemical vapor deposition method after the Be—InGaAs layer 41 is removed through etching, as shown in FIG. 5B.

In the sample produced as described above, each layer can be subjected to the same thermal history as that of the actual waveguide photodiode. It should be noted that the thickness of each layer of the sample corresponds to that of a respective layer of the actual waveguide photodiode.

Figure 5B:
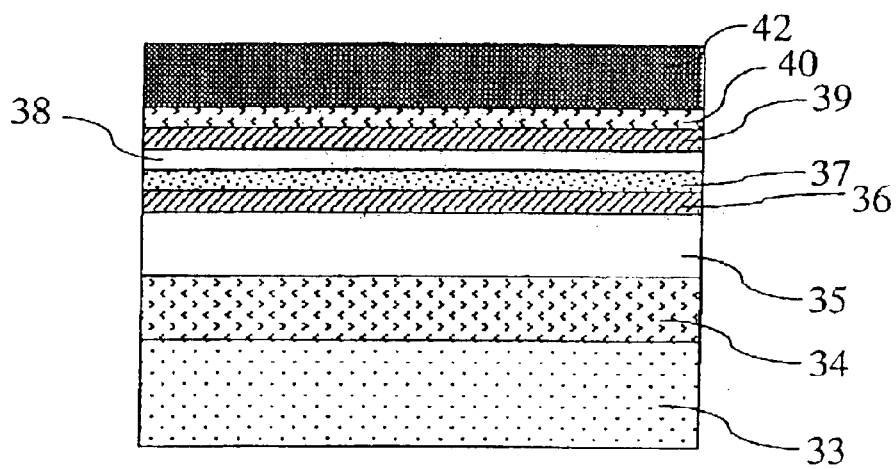
Figure 6:
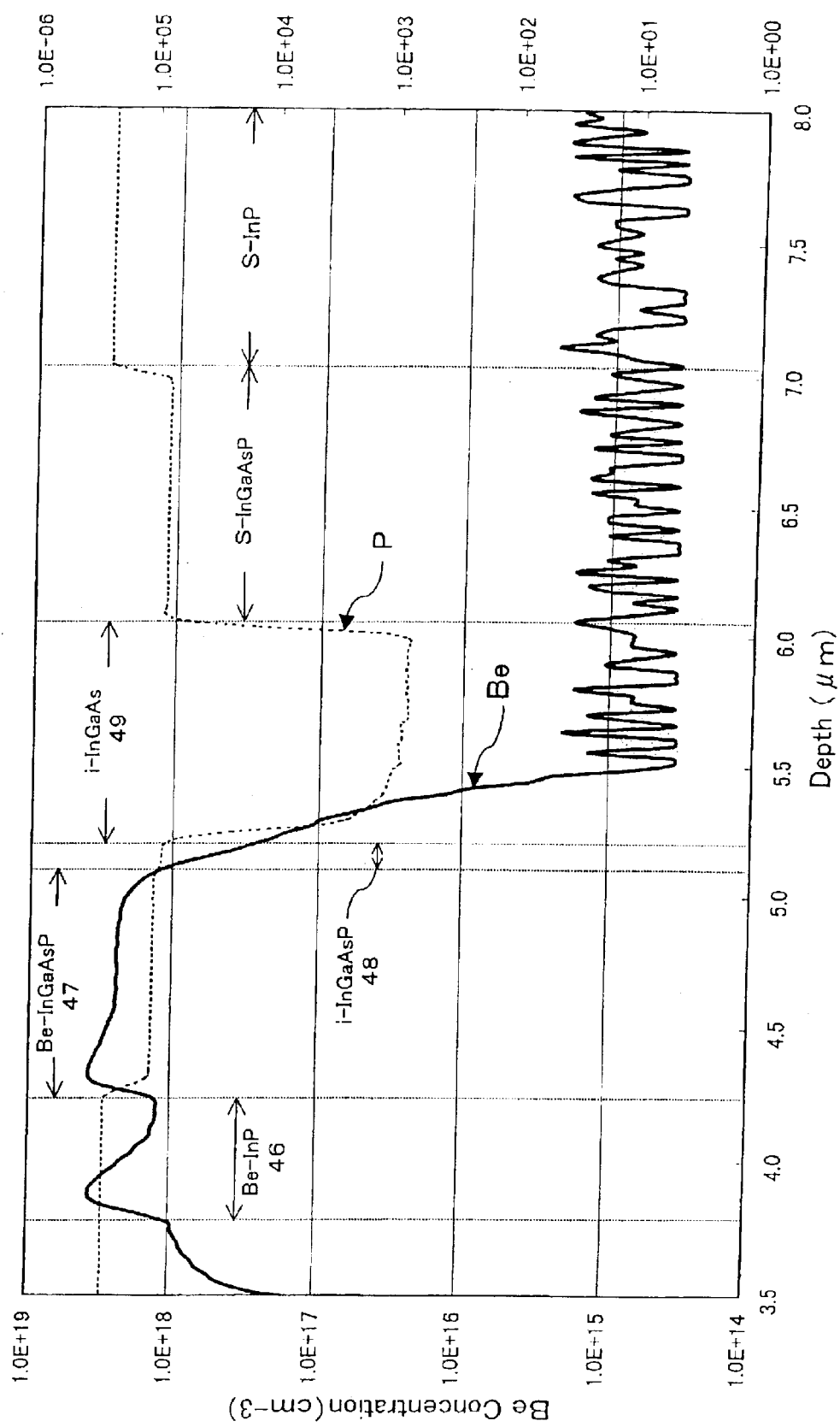
FIG. 6 is measured data obtained by secondary ion mass spectrometry.

FIG. 6 shows an example of measurement data of the sample of FIG. 5B obtained through secondary ion mass spectrometry. In the example shown in the figure, the carrier concentration of the Be—InP layer is set to $1 \times 10^{18}$ cm$^{-3}$ when it is formed.

Figure 7:
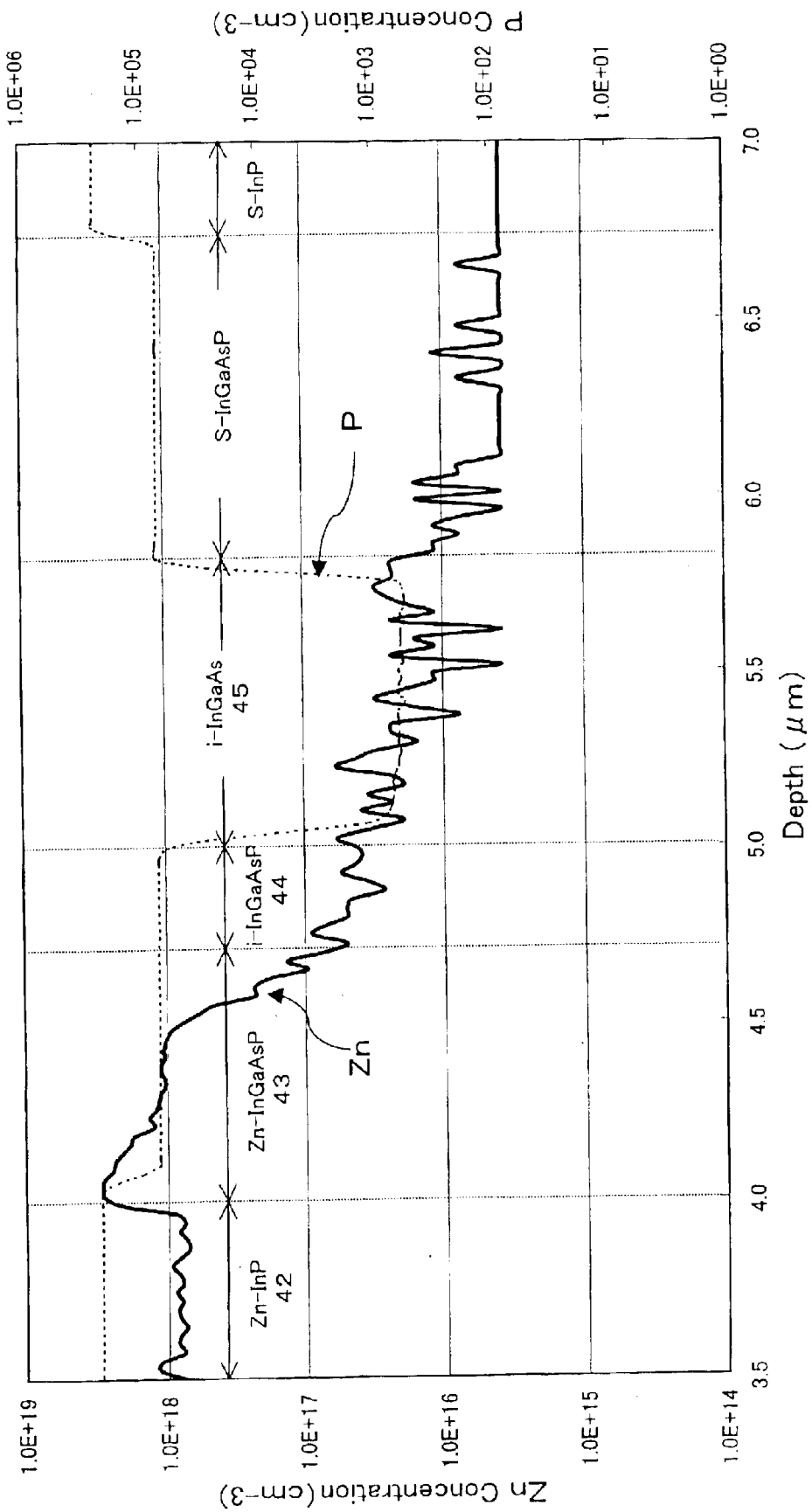
FIG. 7 is measured data obtained by secondary ion mass spectrometry.

FIG. 7, on the other hand, shows an example of measurement data of a Zn-doped, sample which corresponds to a conventional waveguide photodiode. The Zn-doped sample is produced in the same way as the above Be-doped sample.

Description will be first made of the diffusion of Be from the p-InP cladding layer and the p-InGaAsP light confining layer to the i-InGaAs light absorption layer, as compared with that of Zn.

Generally, the impurity concentration of the light absorption 25 layer in waveguide photodiodes must be lower than that in electroabsorption modulators (EA modulators). Specifically, the impurity concentration for electroabsorption modulators must be, for example, $1 \times 10^{16}$ cm$^{-3}$ or less. The impurity concentration for waveguide photodiodes, on the other hand, is preferably $3 \times 10^{15}$ cm$^{-3}$ or less.

In FIG. 7. a Zn—InP layer, 42 corresponds to the p-InP cladding layer, while a Zn—InGaAsP layer 43 corresponds to the p-InGaAsP light confining layer. An i-InGaAsP layer 44 is an undoped layer.

As shown in FIG. 7, Zn has diffused through the entire i-InGaAsP layer 44 and i-InGaAs layer 45. Even though the amount of Zn which has diffused decreases from the i-InGaAsP layer 44 to the i-InGaAs layer 45, the concentration of Zn at each depth in the i-InGaAs layer 45 still exceeds $1 \times 10^{16}$ cm$^{-3}$ on average.

On the other hand, in FIG. 6, a Be—InP layer 46, corresponds to the p-InP cladding layer, while a Be—InGaAsP layer 47 corresponds to the p-InGaAsP light confining layer. An i-InGaAsP layer 48 is an undoped layer.

As shown in FIG. 6, although Be has diffused into the i-InGaAsP layer 48 and the i-InGaAs layer 49, the amount of Be that has diffused into the i-InGaAs layer 49 is considerably smaller than that of Zn in the example of FIG. 7. That is, even though the concentration of Be near the interface surface between the i-InGaAsP layer 48 and the i-InGaAs layer 49 exceeds $1 \times 10^{17}$ cm$^{-3}$, the concentration of Be within the i-InGaAs layer 49 rapidly decreases with increasing depth. Specifically, the concentration of Be within the i-InGaAs layer 49 is $1 \times 10^{17}$ cm$^{-3}$ or less at depths exceeding approximately 80 nm from the interface surface with the i-InGaAsP layer 4B, and $1 \times 10^{16}$ cm$^{-3}$ or less at depths exceeding approximately 0.2 µm. If the depth is further increased to 0.25 µm or more, the concentration of Be becomes lower than $1 \times 10^{15}$ cm$^{-3}$ on average. It should be noted that in the example of FIG. 6, the thickness of the i-InGaAs light absorption layer 49 is approximately 0.85 µm.

Thus, in the above example of prior art in which Zn is doped as a p-type impurity, Zn is observed in the entire light absorption layer at a concentration of more than $1 \times 10^{16}$ cm$^{-3}$, indicating that Zn has widely diffused in the light absorption layer. On the other hand according to the present embodiment, Be has diffused into only approximately a quarter of the entire light absorption layer. As a result, the amount of Be (impurity) that has diffused is considerably small, as compared with the above prior art example in which Zn is doped.

According to the present embodiment, the carrier concentration of the Be—InP layer may be set to $1 \times 10^{18}$ cm$^{-3}$ to $3 \times 10^{18}$ cm$^{-3}$; that of the Be—InGaAsP layer $5 \times 10^{17}$ cm$^{-3}$ to $1 \times 10^{19}$ cm$^{-3}$; and that of the i-InGaAsP layer 20 nm to 100 nm. This arrangement makes it possible to limit the portion of the i-InGaAs layer in which the concentration of Be is $1 \times 10^{16}$ cm$^{-3}$ or more within a predetermined narrow depth range from the interface surface with the i-InGaAsP layer. As a result, the concentration of Be in most of the i-InGaAs layer can be set to $3 \times 10^{15}$ cm$^{-3}$ or less.

Description will be made of diffusion of Be from the p-InP cladding layer and the p-InGaAsP light confining layer to the Fe—InP blocking layer, as compared with that of Zn.

Figure 9:
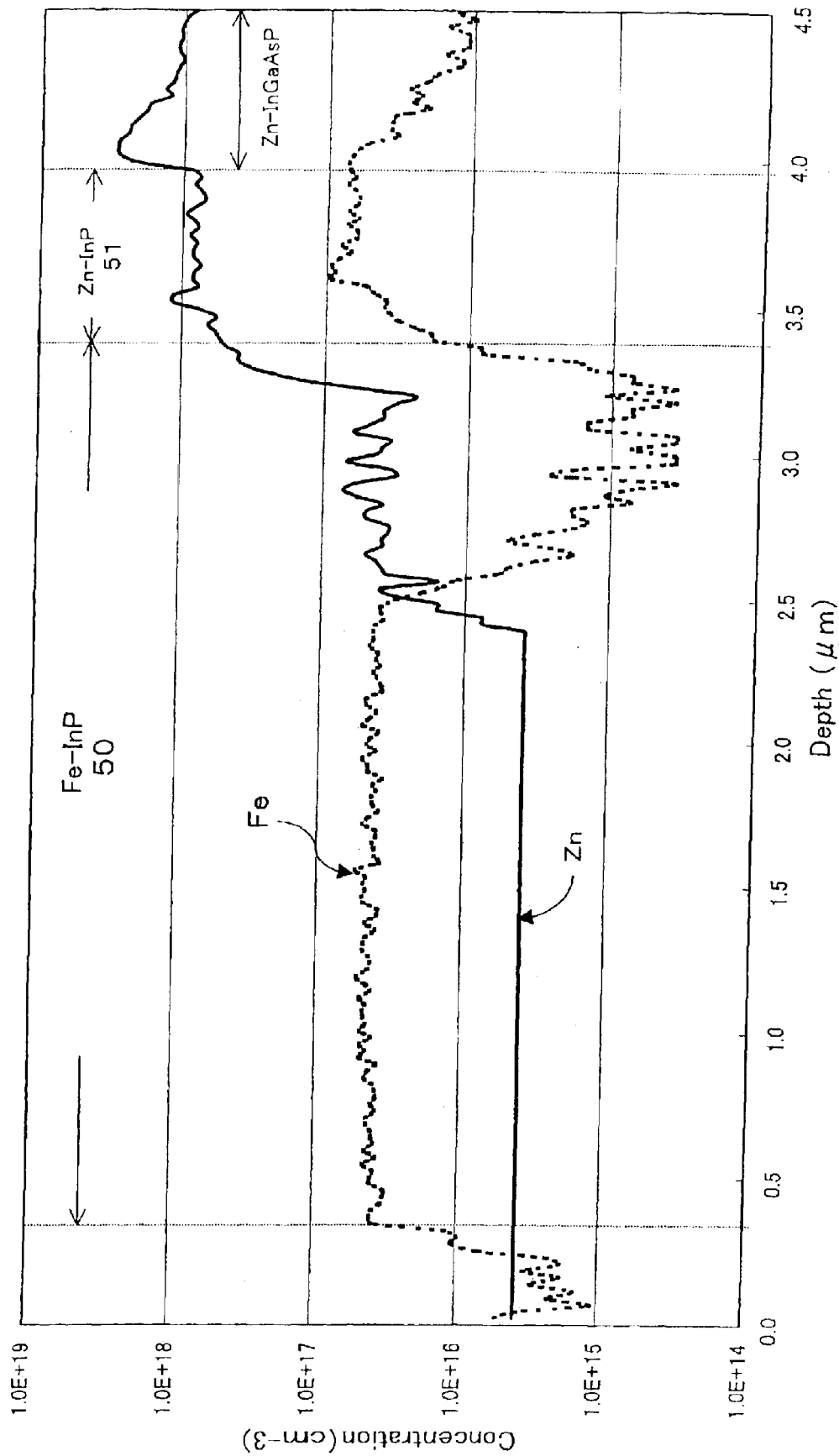
FIG. 9 is measured data obtained by secondary ion mass spectrometry.

FIG. 9 indicates that Zn has diffused into a Fe—InP layer 50. In the example shown in the figure in which the carrier concentration of the p-InP layer is $1 \times 10^{18}$ cm$^{-3}$, Zn has diffused to a depth of approximately 1.5 µm from the interface surface between a Zn—InP layer 51 and the Fe—InP layer 50.

The diffusion mechanism of Zn spreading into the Fe—InP layer is not thermal vibration, which causes Zn to diffuse into the undoped i-InGaAsP layer and the i-InGaAs layer. It is considered that the diffusion of Zn proceeds as Zn replaces the dopant Fe. A region in which the concentration of Zn has become equal to that of Fe (as a result of the replacement of Fe with Zn) is called a counter diffusion region, and the leakage current increases as the size of the counter diffusion becomes larger. Therefore, the smaller the counter diffusion region, the better. Specifically, the width of the counter diffusion region is preferably set to 0.5 µm or less.

In the Fe—InP layer 50 shown in FIG. 9, the concentration of Fe contained in the region into which Zn has hardly diffused is approximately $4 \times 10^{16}$ cm$^{-3}$, and the width of the counter diffusion region in which Zn and Fe each exist at an equal concentration of approximately $4 \times 10^{16}$ cm$^{-3}$ is as wide as 1 µm or more.

Figure 8:
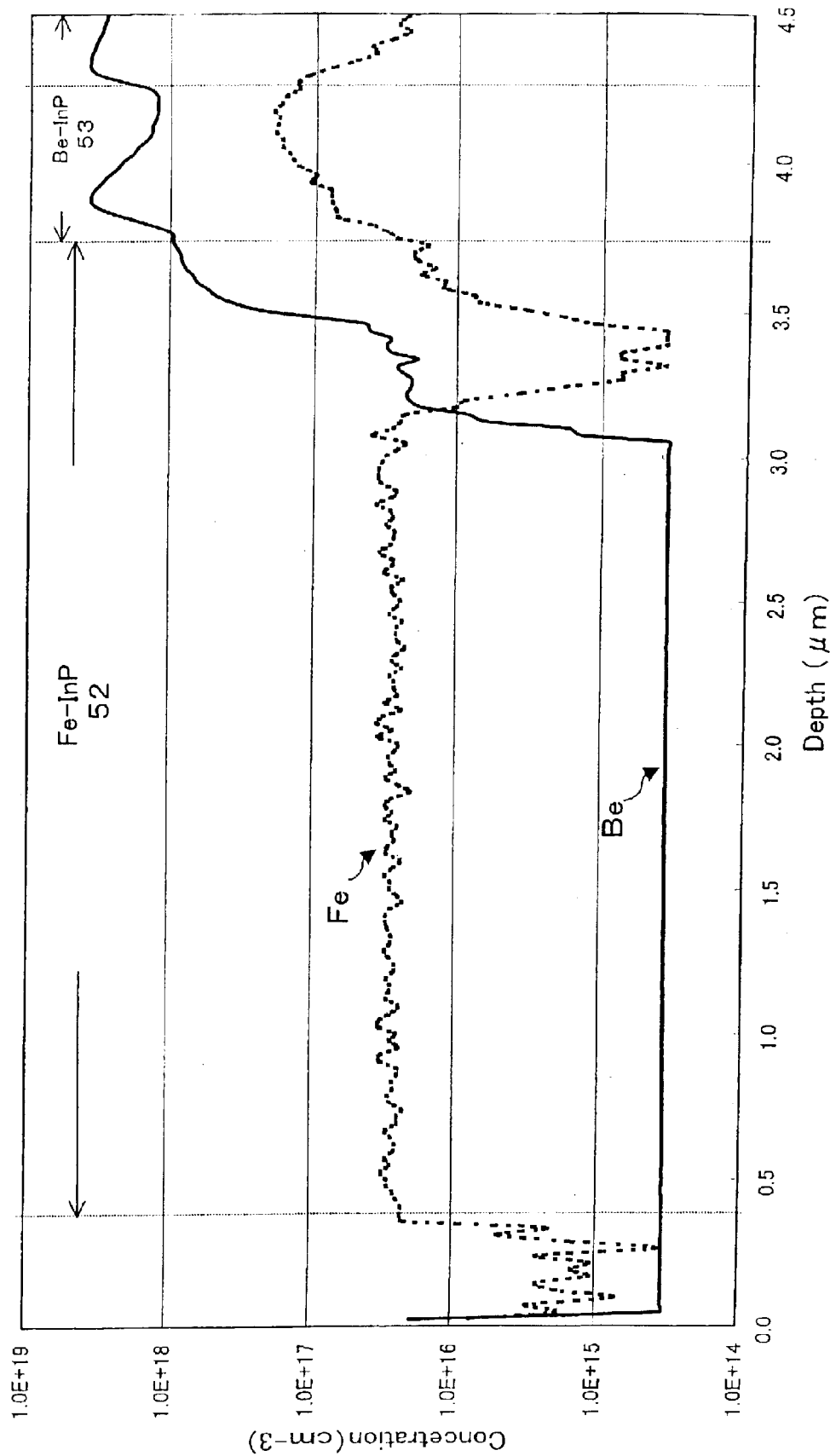
FIG. 8 is measured data obtained by secondary ion mass spectrometry.

On the other hand, FIG. 8 indicates that the diffusion of Be into the a Fe—InP layer 52 is considerably reduced, as compared with the diffusion of Zn. In the example shown in the figure in which the carrier concentration of the p-InP layer is set to $1 \times 10^{18}$ cm$^{-3}$, Be has diffused to a depth of 1 µm or less from the interface surface between a Be—InP layer 53 and the Fe—InP layer 52. Therefore, according to the present embodiment, Be can be used as a p type impurity to reduce the impurity diffusion to the Fe—InP blocking layer.

Further, as shown in FIG. 8 the width of the counter diffusion region in which Be and Fe each exist at an equal concentration of approximately $4 \times 10^{16}$ cm$^{-3}$ is 0.5 Mm or less. Therefore, according to the present embodiment, it is possible to reduce the leakage current and thereby enhance the device characteristics such as high-frequency characteristics and reliability.

In the above measurement through secondary ion mass spectrometry, it is by way of a cladding layer that Be or Zn diffuses from the light confining layer to the blocking layer. Since the actual waveguide photodiode has a structure in which the light confining layer is in direct contact with the blocking layer, the amount of the diffusion to the blocking layer will be larger. However, there is a difference between ease with which Be or Zn replaces Fe in the InGaAsP layer made up of 4 types of elements, and ease with which they replace Fe in the InP layer made up of 2 types of elements. The replacement in the InGaAsP layer is considered to be more difficult. Therefore, also in the actual waveguide photodiode, the diffusion amount of Be is smaller than that of Zn. Furthermore, the total amount of the diffusion in the actual waveguide photodiode is smaller than that obtained by use of the above sample.

Figure 10:
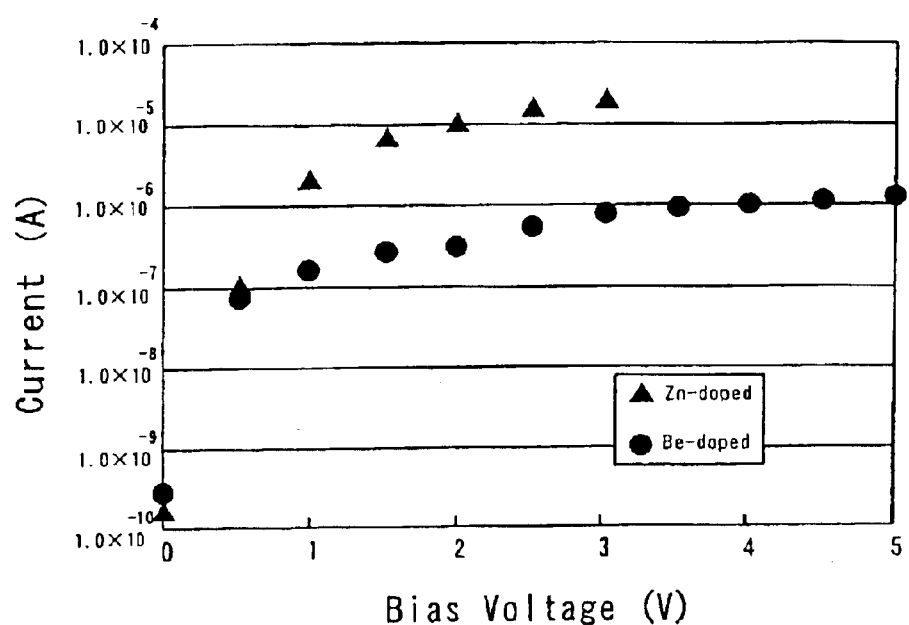
FIG. 10 shows the relationship between current and voltage of a waveguide photodiode according to the present invention.

FIG. 10 shows an example of the current-voltage characteristic of a Be-doped waveguide photodiode in a dark state according to the present embodiment. FIG. 10 also shows an example of the current-voltage characteristic of a conventional Zn-doped waveguide photodiode for comparison. In FIG. 10, compare the current (leakage current) of the present embodiment with that of the conventional waveguide photodiode at a bias voltage of 3V. The current of the conventional waveguide photodiode is 10 $\mu$A or more, while that of the present embodiment is less than 1 $\mu$A. That is, the present embodiment can reduce the leakage current to less than one-tenth of that of the conventional photodiode.

Figure 11:
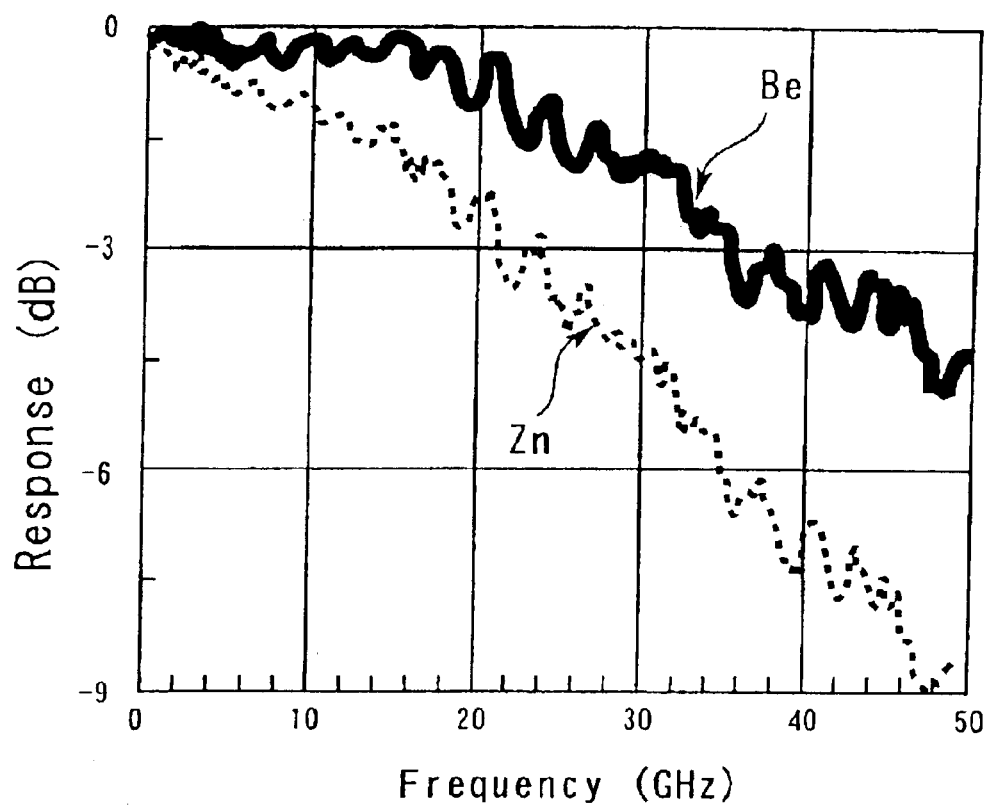
FIG. 11 shows the relationship between frequency and response of a waveguide photodiode according to the present invention.

FIG. 11 shows an example of the frequency response characteristic (the variation of a response with frequency) of a Be-doped waveguide photodiode according to the present embodiment. FIG. 11 also shows an example of a frequency response characteristic of a conventional Zn-doped waveguide photodiode for comparison.

In FIG. 11, compare the 3 dB bandwidth of the present embodiment with that of the conventional waveguide photodiode. A 3 dB bandwidth is the frequency range from zero frequency to the frequency at which a response (gain, etc.) is reduced by 3 dB from its zero-frequency value. The 3 dB bandwidth of the conventional photodiode is approximately 22 GHz, while that of the present embodiment is approximately 36 GHz. Therefore, the present embodiment can increase the 3 dB bandwidth by a factor of 1.5 or more.

Figure 12:
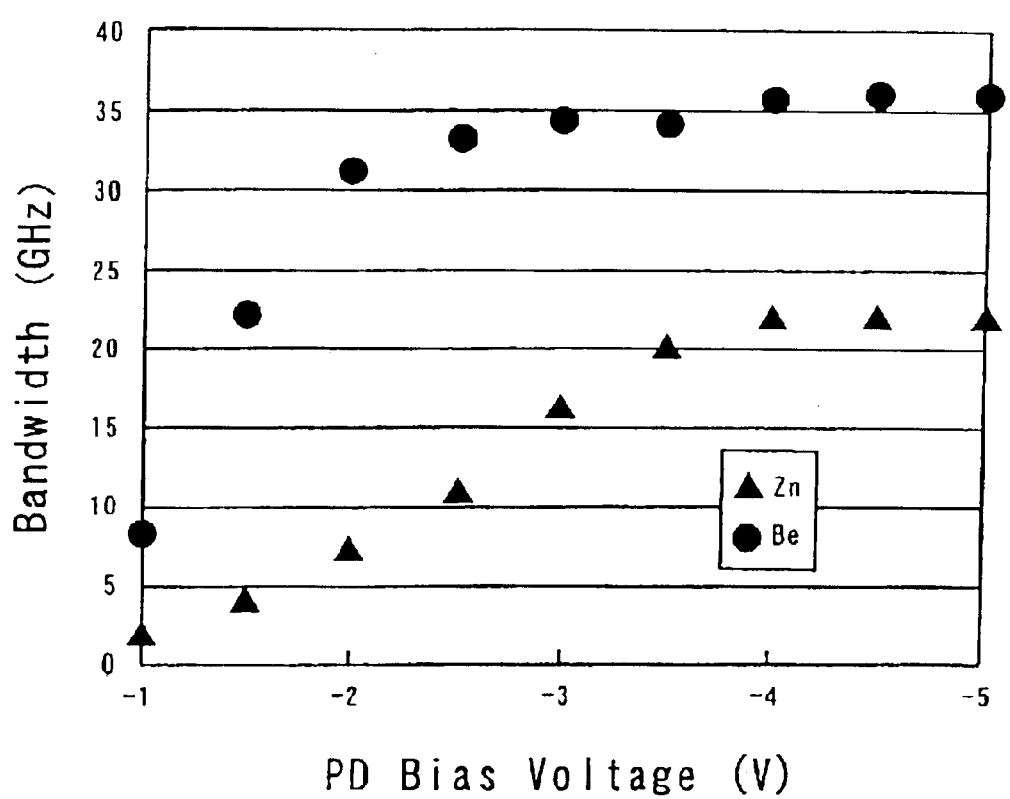
FIG. 12 shows the relationship between voltage and bandwidth of a waveguide photodiode according to the present invention.

Furthermore, FIG. 12 shows the relationship between the voltage and the bandwidth (3 dB bandwidth) of a Be-doped waveguide photodiode according to the present embodiment. FIG. 12 also shows the relationship between the voltage and the bandwidth of a conventional Zn-doped waveguide photodiode for comparison.

In a semiconductor photodiode, reducing the concentration of the impurities diffused within the i-type layer generally leads to a low voltage drive of the device. In FIG. 12, the response of the waveguide photodiode of the present embodiment saturates at a bias voltage of approximately −3V. On the other hand a bias voltage of approximately −4V is required to saturate the response of a conventional waveguide photodiode. That is, the present embodiment can reduce the operation voltage of the device by approximately 20%.

According to the present embodiment described above, Be is doped instead of Zn. However, Mg or C may be doped in a waveguide photodiode having the same configuration as that of the present embodiment with the same effect.

According to the present embodiment described above, a p-type cladding layer and a p type light confining layer are doped with a p-type impurity selected from a group consisting of Be, Mg, and C. However, the present invention is not limited to this specific arrangement. One of the p-type cladding layer and the p-type light confining layer may be doped with Zn, and the other layer may be doped with a p-type impurity selected from a group consisting of Be, Mg, and C. With this arrangement it is possible to increase the total carrier concentration and thereby reduce the resistance of the device. In this case, to reduce the impurity diffusion into the light absorption layer, the p-type cladding layer may be preferably doped with Zn.

Further according to the present embodiment, a single undoped layer is formed on the light absorption layer. However, the present invention is not limited to this specific arrangement. Two undoped layers may be employed. For example, one of them may be a layer in which it is difficult to diffuse impurities, and the other may be a layer having a high light confinement efficiency. With this arrangement, it is possible to reduce the impurity diffusion and enhance the quantum efficiency.

As described above, the present embodiment makes it possible to obtain a waveguide photodiode in which the p-type impurity concentrations of the light absorption layer and the blocking layer are small, resulting in a reduced number of leakage paths and low voltage operation.

Second Embodiment

According to the first embodiment, at least one of a p-type cladding layer and a p-type light confining layer is doped with a p-type impurity selected from a group consisting of Be, Mg, and C. The second embodiment, on the other hand, is characterized in that at least one of the p-type cladding layer and the p-type light confining layer is doped with two or more types of p-type impurities. In such a case, at least one of the two or more types of p-type impurities is preferably a p-type impurity selected from a group consisting of Be, Mg, and C.

The second embodiment may employ the same waveguide photodiode as that for the first embodiment shown in FIG. 2. Specifically, a waveguide photodiode of the present embodiment includes an n-InGaAs contact layer 7 an n-InP cladding layer 8, an n-InGaAsP light confining layer 9, an i-InGaAs light absorption layer 10, a p-InGaAsP light confining layer 11, a p-InP cladding layer 12, and a p-InGaAs contact layer 13. Furthermore, a Fe—InP blocking layer 14 is formed in a predetermined area on the n-InP cladding layer 8, and an insulating film 15is formed on the Fe—InP blocking layer 14. The p-type electrode 4 is formed on the p-InGaAs contact layer 13 and a portion of the insulating film 15, while the n-type electrode 3 is formed on the n-InGaAs contact layer 7. In the example shown in FIG. 2, the n-type electrode 3 is also formed on the sides of the n-InP cladding layer 8 and the Fe—InP blocking layer 14 and on the insulating film 15.

According to the present embodiment, either the p-InP cladding layer 12 or the p-InGaAsP light confining layer 11 or both may be doped with both Be and Zn.

The resistance of the device can be reduced by a larger amount as the amount of Zn doped in the p-type layer increases. However, an increase in the amount of Zn doped in the p-type layer leads to an increase in the amount of Zn diffusing from the p-type layer to the i-InGaAs light absorption layer and the Fe—InP blocking layer, resulting in increased leakage current of the device. Therefore, an appropriate amount of Zn to be doped in the p-type layer may be determined depending on desired device characteristics.

The element Be, on the other hand, has a small diffusion coefficient, as compared with Zn, but it can be used as a dopant at only a low concentration. Therefore, use of both Zn and Be as dopants makes it possible to increase the carrier concentration and reduce the impurity diffusion into the light absorption layer and the blocking layer, at the same time. The light absorption layer can be depleted at low voltage by reducing the impurity concentrations of the light absorption layer and the blocking layer. As a result, use of both Zn and Be as dopants can reduce not only the resistance of the device but also the operational voltage and the leakage current.

It should be noted that according to the present embodiment, the p-InP cladding layer 12 and/or the p-InGaAsP light confining layer 11 may be doped with a combination of Zn and Mg, or Zn and C, instead of the combination of Zn and Be. Both Mg and C have a small diffusion coefficient, as compared with Zn, and therefore use of one of them and Zn as dopants produces the same effect.

A dopant to be used together with Be, Mg, or C is not limited to Zn. Any dopant which can increase the carrier concentration may be employed. According to the present embodiment, any dopant which can increase the carrier concentration means any dopant whose maximum carrier, concentration in a p-type layer is large, as compared with Be, Mg, and C.

Further according to the present embodiment, the p-InP cladding layer 12 and/or the p-InGaAsP light confining 11 may be doped with two or more types of dopants selected from a group consisting of Be, Mg, and C. These dopants each have a small diffusion coefficient. Use of a plurality of them as dopants can increase the carrier concentration. Therefore, it is possible to reduce the resistance of the device while keeping the impurity concentrations of the light absorption layer and the blocking layer at a low level.

Still further according to the present embodiment, the p-InP cladding layer 12 and/or the p-InGaAsP light confining layer 11 may be doped with one or more types of dopants which can increase the carrier concentration, such as Zn, and two or more types of dopants selected from a group consisting of Be, Mg, and C.

According to the present embodiment, the thicknesses of the n-InGaAsP light confining layer 9 and the p-InGaAsP light confining layer 11 are preferably each set to 0.2 $\mu$m to 1.5 $\mu$m, more preferably 0.3 $\mu$m to 1.2 $\mu$m. Setting the thickness of the light confining layer too thin leads to a reduction in the light confinement efficiency, which is undesirable. Setting the thickness of the light confining layer too thick also leads to a reduction in the light confinement efficiency and furthermore an increase in the -resistance results, which is also undesirable.

According to the present embodiment, an undoped InGaAsP layer is preferably formed between the i-InGaAs light absorption layer 10 and the p-InGaAsP light confining layer 11. The undoped InGaAsP layer may be a single layer, or it may be made up of two or more layers. The thickness of the undoped InGaAsP layer is preferably 300 nm or less, more preferably 20 nm to 100 nm.

The formation of the undoped layer on the light absorption i-layer means that the layer doped with a p-type impurity (that is, the p-type light confining layer) and the light absorption layer are separated by the undoped layer. Therefore it is possible to reduce the impurity diffusion to the light absorption layer even when a dopant having a large diffusion coefficient is used to increase the carrier concentration.

To reduce the impurity diffusion to the light absorption layer, the thicker the undoped layer, the better. However, since the resistance of an undoped layer is generally high, the device resistance increases as the undoped layer becomes thicker. The thickness of the undoped layer is preferably determined by comparing the diffusion characteristics and resistances of impurities based on desired device characteristics.

According to the present embodiment, the thickness of the i-InGaAs light absorption layer 10 is preferably set to 1.5 $\mu$m or less more preferably 1 $\mu$m or less, even more preferably 0.4 $\mu$m to 0.6 $\mu$m. Better frequency characteristics are obtained with a thinner light absorption layer. However, it is not preferable to make the light absorption layer too thin since it degrades the characteristics of the device.

In waveguide photodiodes, when the length of the i-InGaAs light absorption layer in a direction parallel to the traveling direction of the light is set to, for example, 16 $\mu$m, if the thickness of the layer is 1.5 $\mu$m or less, a quantum efficiency of 50% or more can be obtained. Further, with the thickness of the i-InGaAs light absorption layer set to 1.0 $\mu$m or less, it is possible to obtain a quantum efficiency of 60% or more. Still further, if the thickness of the i-InGaAs light absorption layer is 0.4 $\mu$m to 0.6 $\mu$m, it is possible to obtain a quantum efficiency of 70%.

According to the present embodiment, the p-type contact layer may be doped with two or more types of dopants selected from a group consisting of Be, Mg, C. Or alternatively the p-type contact layer may be doped with one or more types of dopants selected from a group consisting of Be, Mg, C and a type of dopant which can increase the carrier concentration, such as Zn. With this arrangement, it is possible to reduce the impurity diffusion to the blocking layer and the light absorption layer and increase the carrier concentration of the p-type contact layer so as to lower the contact resistance between the p-type contact layer and the p-type electrode.

The manufacturing method of a waveguide photodiode according to the present embodiment is the same as that of the first embodiment described above.

According to the present embodiment, a p-type cladding layer and/or a p-type light confining layer may be doped with both a dopant which can increase the carrier concentration and a dopant which has a small diffusion coefficient to reduce not only the impurity concentrations of the light absorption layer and the blocking layer but also the resistance of the p-type layer element.

According to the present embodiment, a p-type contact layer may be doped with both a dopant which can increase the carrier concentration and a dopant which has a small diffusion coefficient to reduce not only the impurity concentrations of the light absorption layer and the blocking layer but also the contact resistance between the p-type contact layer and the p-type electrode.

The present invention is not limited to the waveguide photodiodes of the first and second embodiments described above. The present invention can be applied to any waveguide semiconductor optical device having a structure in which the p/i/n junction is sandwiched by semi-insulative blocking layers.

The features and advantages of the present invention may be summarized as follows.

According to one aspect, since the impurity diffusion from the p-type layer to the light absorption layer and the blocking layer can be reduced, it is possible to reduce the leakage current and thereby enhance the device characteristics.

According to another aspect, it is possible to reduce the concentration of p-type impurities in the light absorption layer and the blocking layer as well as increasing the carrier concentration of the p-type layer.

For further reference, a method of manufacturing a waveguide photodiode according to the present invention may be summarized as follows.

According to one aspect of the present invention, in a method for manufacturing a waveguide photodiode in which an n-type cladding layer, an n-type light confining layer, an i-type light absorption layer, a p-type light confining layer, and a p-type cladding layer are buried in a Fe—InP blocking layer in that order over a semiconductor substrate, the p-type light confining layer is formed by use of a metal organic chemical vapor deposition method using as a p-type impurity a material selected from a group consisting of beryllium, magnesium, and carbon. The Fe—InP blocking layer is formed by use of a metal organic chemical vapor deposition method.

Preferably, the method for manufacturing the waveguide photo diode further comprises, a step of forming an undoped layer between said i-type light absorption layer and the p-type light confining layer.

Preferably, the method for manufacturing the waveguide photodiode further comprises a step of forming the p-type cladding layer by use of a metal organic chemical vapor deposition method using as a p-type impurity a material selected from a group consisting of beryllium, magnesium, and carbon.

Preferably, in the method for manufacturing the waveguide photodiode a thickness of the undoped layer is 20 nm to 100 nm, a concentration of the p-type impurity in the p-type light confining layer is $5 \times 10^{17}$ cm$^{-3}$ to $1 \times 10^{19}$ cm$^{-3}$ and a concentration of the p-type impurity in the p-type cladding layer is $1 \times 10^{18}$ cm$^{-3}$ to $3 \times 10^{18}$ cm$^{-3}$.

Preferably, in the method for manufacturing the waveguide photodiode, the n-type cladding layer is an n-InP layer, the n-type light confining layer is an n-InGaAsP layer, the i-type light absorption layer is an i-InGaAs layer the undoped layer is an InGaAsP layer, the p-type light confining layer is a p-InGaAsP layer, and the p-type cladding layer is a p-InP layer.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2002-306292, filed on Oct. 21, 2002 including specification, claims, drawings and summary, on which the Convention priority of the present application is based are incorporated herein by reference in its entirety.

What is claimed is:

1. A waveguide photodiode comprising:
   a semiconductor substrate;
   an n-type cladding layer;
   an n-type light confining layer;
   an i-type light absorption layer;
   a p-type light confining layer;
   a p-type cladding layer; and
   an Fe—InP blocking layer, wherein
      said n-type cladding layer, said n-type light confining layer, said i-type light absorption layer, said p-type light confining layer, and said p-type cladding layer are buried in said Fe—InP blocking layer, in that order, on said semiconductor substrate, and
      at least one of said p-type light confining layer and said p-type cladding layer contains, as a p-type impurity, a material selected from the group consisting of beryllium, magnesium, and carbon.

2. The waveguide photodiode according to claim 1, further comprising a p-type contact layer on said p-type cladding layer, wherein said p-type contact layer contains, as a p-type impurity, a material selected from the group consisting of beryllium, magnesium, and carbon.

3. The waveguide photodiode according to claim 1, further comprising an undoped layer between said i-type light absorption layer and said p-type light confining layer.

4. The waveguide photodiode according to claim 3, wherein said undoped layer has a thickness in the range from 20 nm to 100 nm.

5. A waveguide photodiode comprising:
   a semiconductor substrate;
   an n-type cladding layer;
   an n-type light confining layer;
   an i-type light absorption layer;
   a p-type light confining layer;
   a p-type cladding layer;
   a Fe—InP blocking layer; and
   a p-type contact layer, wherein
      said n-type cladding layer, said n-type light confining layer, said i-type light absorption layer, said p-type light confining layer, and said p-type cladding layer are buried in said Fe—InP blocking layer, in that order, on said semiconductor substrate,
      said p-type contact layer is on said p-type cladding layer, and
      at least one of said p-type light confining layer, said p-type cladding layer, and said p-type contact layer contains, as p-type impurities, at least two materials selected from the group consisting of zinc, beryllium, magnesium, and carbon.

6. The waveguide photodiode according to claim 5, further comprising an undoped layer between said i-type light absorption layer and said p-type light confining layer.

7. A waveguide photodiode comprising:
   a semiconductor substrate;
   an n-type cladding layer;
   an n-type light confining layer;
   an i-type light absorption layer;
   a p-type light confining layer;
   a p-type cladding layer; and
   an Fe—InP blocking layer, wherein
      said n-type cladding layer, said n-type light confining layer, said i-type light absorption layer, said p-type light confining layer, and said p-type cladding layer are buried in said Fe—InP blocking layer, in that order, on said semiconductor substrate; and
      said Fe—InP blocking layer includes a counter diffusion region including Fe and a p-type impurity and having a width not exceeding 0.5 $\mu$m.

* * * * *